(12) United States Patent
Su

(10) Patent No.: US 12,063,043 B2
(45) Date of Patent: Aug. 13, 2024

(54) CLOCK SCHEME CIRCUIT AND A MOBILE DOUBLE DATA RATE MEMORY USING THE CLOCK SCHEME CIRCUIT

(71) Applicant: MEDIATEK INC., Hsinchu (TW)

(72) Inventor: Guan-Yu Su, Hsinchu (TW)

(73) Assignee: MEDIATEK INC., Hsinchu (TW)

(*) Notice: Subject to any disclaimer, the term of this patent is extended or adjusted under 35 U.S.C. 154(b) by 0 days.

(21) Appl. No.: 18/170,088

(22) Filed: Feb. 16, 2023

(65) Prior Publication Data

US 2023/0412174 A1 Dec. 21, 2023

Related U.S. Application Data

(60) Provisional application No. 63/351,916, filed on Jun. 14, 2022.

(51) Int. Cl.
*H03L 7/081* (2006.01)
*H03L 7/099* (2006.01)
*H03L 7/18* (2006.01)

(52) U.S. Cl.
CPC .......... *H03L 7/0818* (2013.01); *H03L 7/0998* (2013.01); *H03L 7/1806* (2013.01)

(58) Field of Classification Search
CPC ....... H03L 7/0998; H03L 7/1806; H03L 7/07; H03L 7/0812; H03L 7/0814; H03L 7/0816; H03L 7/081; H03L 7/08; H03L 7/06; H03L 7/087; H03L 7/18; H03L 7/0818; H03L 7/0805; H03L 7/0891; G06F 1/08; G06F 1/3275; G06F 1/10; G06F 1/12; G06F 1/06; G06F 1/04; G11C 11/4076; G11C 7/222; H04L 7/0337; H04L 7/0008;
(Continued)

(56) References Cited

U.S. PATENT DOCUMENTS

| 7,886,178 B2* | 2/2011 | Maeda | G11C 7/22 327/156 |
| 2009/0009228 A1* | 1/2009 | Jang | H03K 5/133 327/295 |

(Continued)

FOREIGN PATENT DOCUMENTS

| EP | 3 170 262 A1 | 5/2017 |
| WO | 2012/158392 A1 | 11/2012 |

(Continued)

OTHER PUBLICATIONS

Extended European Search Report dated Nov. 8, 2023, issued in application No. EP 23174151.3.

*Primary Examiner* — John W Poos
(74) *Attorney, Agent, or Firm* — McClure, Qualey & Rodack, LLP

(57) ABSTRACT

A clock scheme circuit with low power consumption is shown. A local clock generator is coupled to a global clock generator through a global clock trace to receive a global clock signal, and generate a local clock signal based on the global clock signal. The local clock generator uses a frequency multiplier to multiply the frequency of the global clock signal by a multiplication factor of not less than 1. Thus, the global clock signal transferred through the global clock trace can be a lower-frequency signal in comparison with the local clock signal. The power consumption along the global clock trace is considerably reduced.

15 Claims, 7 Drawing Sheets

(58) Field of Classification Search
CPC ... H04L 7/0025; H04L 7/0338; H04L 7/0012; H04L 7/033; H03K 5/135
See application file for complete search history.

(56) References Cited

U.S. PATENT DOCUMENTS

2010/0039157 A1* 2/2010 Kaeriyama ............ H03K 5/133
327/292
2013/0055004 A1 2/2013 Koniaris
2015/0229298 A1* 8/2015 Tomita ................... H03K 3/012
327/143

FOREIGN PATENT DOCUMENTS

WO 2016/010629 A1 1/2016
WO 2022/119909 A1 6/2022

* cited by examiner

CLOCK SCHEME CIRCUIT AND A MOBILE DOUBLE DATA RATE MEMORY USING THE CLOCK SCHEME CIRCUIT

CROSS REFERENCE TO RELATED APPLICATIONS

This application claims the benefit of U.S. Provisional Application No. 63/351,916, filed Jun. 14, 2022, the entirety of which is incorporated by reference herein.

BACKGROUND OF THE INVENTION

Field of the Invention

The present invention relates to a clock scheme circuit, and, in particular, to a high-speed mobile double data rate memory (DDR).

Description of the Related Art

Mobile DDR (also known as MDDR, Low Power DDR or LPDDR) is a type of DDR SDRAM, specially used in mobile electronic products, such as smartphones, etc. In a mobile DDR, such a high-speed design, its clock scheme circuit may consume too much power.

A low-power clock circuit scheme is called for.

BRIEF SUMMARY OF THE INVENTION

A clock scheme circuit with low power consumption is proposed.

A clock scheme circuit in accordance with an exemplary embodiment of the present invention has a global clock generator, a global clock trace, and a local clock generator. The local clock generator is coupled to the global clock generator through the global clock trace to receive a global clock signal, and thereby generates a local clock signal based on the global clock signal. The local clock generator has a frequency multiplier. The local clock generator generating the local clock signal uses the frequency multiplier to multiply the frequency of the global clock signal by a multiplication factor of not less than 1. In this manner, the global clock signal can be a low-frequency signal in comparison with the local clock signal. Less power is consumed along the global clock trace. The power efficiency of the clock scheme circuit is great.

In an exemplary embodiment, the frequency multiplier is provided by a multiplying delay-locked loop (MDLL). In another exemplary embodiment, the frequency multiplier is provided by a circuit that multiples the frequency by 1 (e.g., a delay-locked loop (DLL), or a phase-looked loop (PLL)).

In an exemplary embodiment, the local clock generator further has a multi-phase generator provides the frequency multiplier. The multi-phase generator generates split-phase clock signals to be processed to generate the local clock signal.

In an exemplary embodiment, the local clock generator further has a plurality of phase selection multiplexers and a phase interpolator. Each phase selection multiplexer receives several of the split-phase clock signals to output selected two split-phase clock signals. The phase interpolator is coupled to output terminals of the phase selection multiplexers to perform phase interpolation on split-phase clock signals selected by the phase selection multiplexers, for generation of the local clock signal. In an exemplary embodiment, the local clock generator further has a driver, receiving a phase-interpolated clock signal from the phase interpolator to generate and output the local clock signal. In an exemplary embodiment, the driver has a frequency divider, dividing the frequency of the phase-interpolated clock signal to generate the local clock signal.

In another exemplary embodiment, the local clock generator further has a phase selection multiplexer, receiving all of the split-phase clock signals to output one selected split-phase clock signal for generation of the local clock signal. In such an exemplary embodiment, the local clock generator does not use any phase interpolator that consumes considerable power. In an exemplary embodiment, the local clock generator further has a driver, receiving the selected split-phase clock signal from the phase selection multiplexer to generate and output the local clock signal. In an exemplary embodiment, the driver has a frequency divider, dividing the frequency of the selected split-phase clock signal to generate the local clock signal.

In an exemplary embodiment, the global clock generator uses just one phase-locked loop (PLL) to generate the global clock signal. The frequency multiplier within the local clock generator is switched to provide different multiplication factors to multiply the frequency of the global clock signal, and the multiplication factors all are not less than one.

In another exemplary embodiment, the global clock generator uses multiple phase-locked loops (PLLs) to generate multiple global clock candidates. A clock gating multiplexer is provided on the global clock trace to select one of the global clock candidates as the global clock signal to be transferred to the local clock generator.

In an exemplary embodiment, the local clock generator is coupled to a functional unit with a local clock trace, and the global trace is longer than the local clock trace. The global trace may be X times longer than the local clock trace.

In an exemplary embodiment, a mobile double data rate memory is shown, which includes a DQ unit and the forgoing clock scheme circuit. The DQ unit has a transmitter and a receiver. The clock scheme circuit provides the local clock signal to the transmitter, the receiver, or both through a local clock trace.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
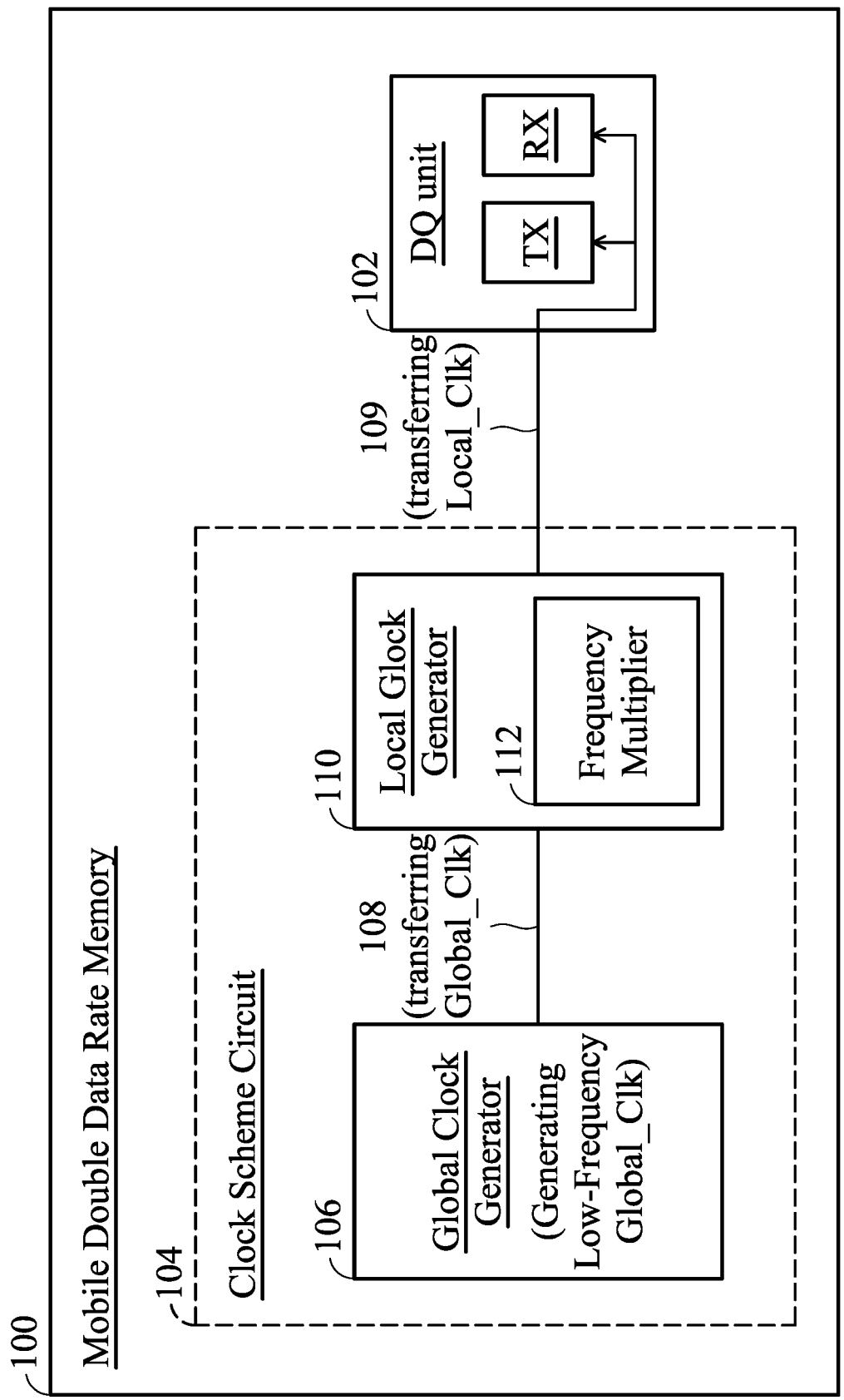
FIG. 1 depicts a mobile double data rate memory (abbreviated as MDDR, or LPDDR) 100 in accordance with an exemplary embodiment of the present invention.

FIG. 1 depicts a mobile double data rate memory (abbreviated as MDDR, or LPDDR) 100 in accordance with an exemplary embodiment of the present invention.

The mobile double data rate memory 100 has a DQ unit 102 and a clock scheme circuit 104. The DQ unit 102 may correspond to a memory cell, for read/write of the memory cell. The DQ unit 102 has a transmitter TX and a receiver RX for read/write data from/into the memory cell. The transmitter TX and/or the receiver RX operate according to a local clock signal Local_Clk provided by the clock scheme circuit 104.

The clock scheme circuit 104 has a global clock generator 106, a global clock trace 108, and a local clock generator 110. The local clock generator 110 is coupled to the global clock generator 106 through the global clock trace 108 to receive a global clock signal Global_Clk. The local clock generator 110 generates the local clock signal Local_Clk based on the global clock signal Global_Clk and the local clock signal Local_Clk is transferred to the DQ unit 102 through a local clock trace 109. In the present embodiment, the global clock signal Global_Clk is a single phase signal. Especially, the local clock generator 110 has a frequency multiplier 112, which is provided to multiply the frequency of the global clock signal Global_Clk by a multiplication factor (M) of not less than 1, for generation of the local clock signal Local_Clk. Because the local clock generator 110 has the frequency multiplier 112, the global clock signal Global_Clk transferred from the global clock generator 106 to the local clock generator 110 through the global clock trace 108 can be a low-frequency signal in comparison with the local clock signal Local_Clk transferred from the local clock generator 110 to the DQ unit 102 through the local clock trace 109. The local clock signal Local_Clk should be very high for operations of the transmitter/receiver (TX/RX) of the DQ unit 102. In the present embodiment, the local clock trace 109 is shorter than the global clock trace. In some embodiments, the length of the global clock trace 108 is more than 10 times longer than the length of the local clock trace. That said, the higher frequency local clock signal Local_Clk travels shorter length of the local clock trace 109, and the lower frequency global clock signal Global_Clk travels longer length of the global clock trace 108. With such design of the present embodiment, the less power is consumed on the global clock trace 108. The power efficiency of the clock scheme circuit 104 is improved. In some exemplary embodiments, the DQ unit 102 may be replaced by any functional unit. In some exemplary embodiments, the length of the global clock trace 108 is X times longer than the length of the local clock trace, X is a number greater than 1.

In an exemplary embodiment, the frequency multiplier 112 is provided by a multiplying delay-locked loop (MDLL). In such a case, the multiplication factor (M) introduced by the frequency multiplier 112 is greater than one, and the global clock signal Global_Clk transferred from the global clock generator 106 to the local clock generator 110 through the global clock trace 108, therefore, oscillates at a very low frequency. The power consumption of the global clock trace 108 is considerably reduced.

In another exemplary embodiment, the frequency multiplier 112 is provided by a delay-locked loop (DLL) or a phase-locked loop (PLL). In such a case, the multiplication factor (M) introduced by the frequency multiplier 112 is one. In comparison with a conventional technology that uses a frequency divider to reduce the frequency of a high-frequency global clock signal for local use, the DLL/PLL with the multiplication factor, 1, allows the global clock signal Global_Clk has a reasonable oscillation frequency rather than a very high frequency. The power consumption of the global clock trace 108 is reduced, too.

Figure 2:
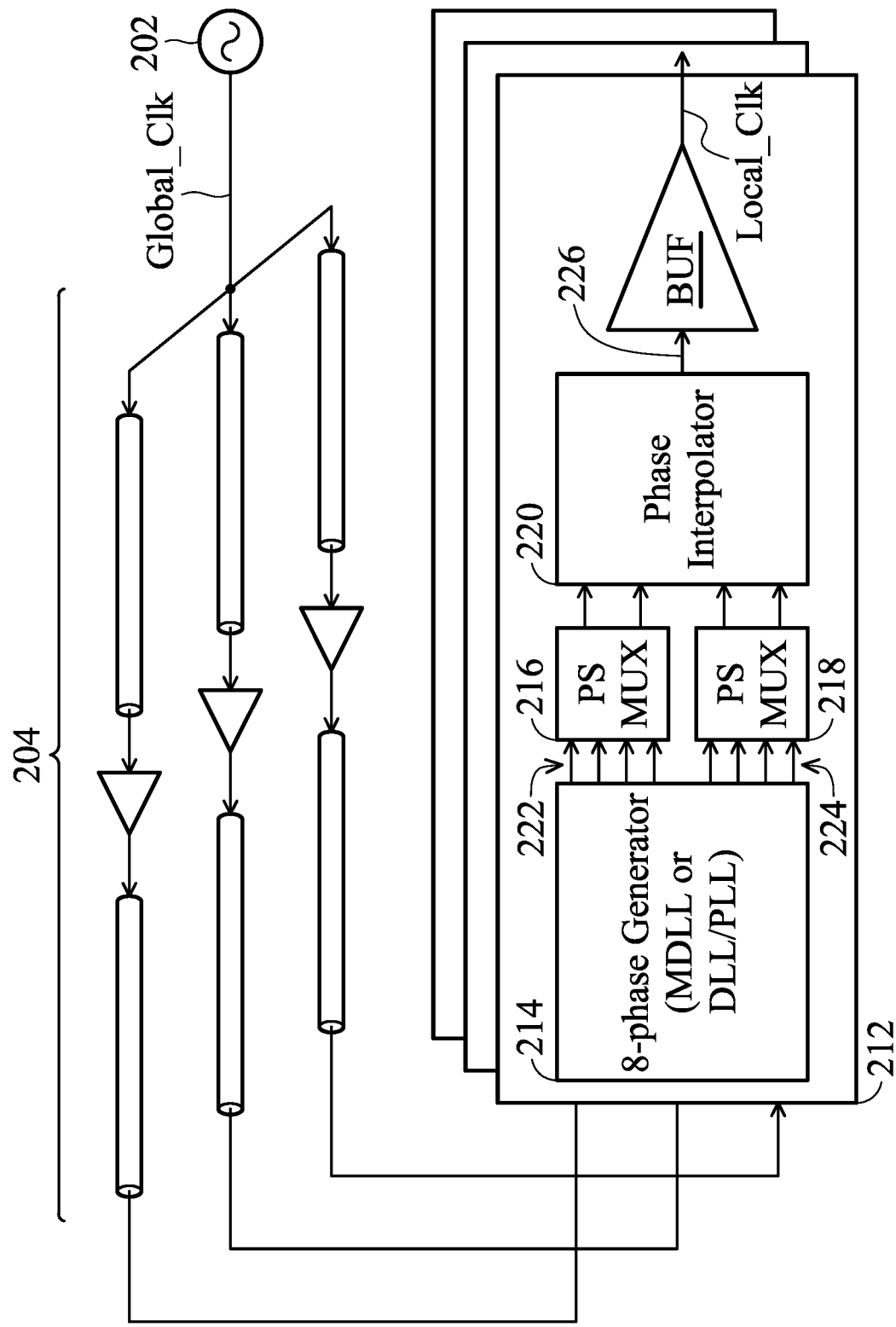
FIG. 2 illustrates the details of the clock scheme circuit 104 in accordance with an exemplary embodiment of the present invention.

FIG. 2 illustrates the details of the clock scheme circuit 104 in accordance with an exemplary embodiment of the present invention. Three layers of circuits are shown in FIG. 2; two layers for data TX/RX, and one layer for command TX/RX.

In FIG. 2, there is a single oscillator 202 (e.g. a phase-locked loop, abbreviated as PLL) for implementation of the global clock generator 106 of FIG. 1. The global clock trace 204 may include an AC coupled device for power domain transformation, clock gating (CG) elements, flyby elements (e.g., buffers), and duty cycle correctors (DCC). The global clock signal Global_Clk generated by the single oscillator 202 is transferred to the local clock generator 212 through the global clock trace 204. Because the global clock signal Global_Clk oscillates at the lower frequency than a conventional technique, the global clock trace 204 operates at the lower frequency and saves considerable power. The local clock generator 212 has an 8-phase generator 214, two phase selection multiplexers 216 and 218, a phase interpolator 220, and a driver BUF (e.g., an ARBUF). The 8-phase generator 214 may be a multiplying delay-locked loop (MDLL) or a delay-locked loop (DLL)/phase-locked loop (PLL), which implements the function of the frequency multiplier 112 of FIG. 1, and generates split-phase clock signals (the four signals indicated by 222 and the other four signals indicated by 224). The phase selection multiplexer 216 receives the split-phase clock signals 222 to output the selected two split-phase clock signals. The phase selection multiplexer 218 receives the split-phase clock signals 224 to output the selected two split-phase clock signals. The phase interpolator 220 is coupled to the output terminals of the phase selection multiplexers 216 and 218 to perform phase interpolation on the split-phase clock signals selected by the phase selection multiplexers 216 and 218. The driver BUF receives a phase-interpolated clock signal 226 from the phase interpolator 220 to generate and output the local clock signal Local_Clk. Moreover, the single oscillator 202 generates a single phase global clock signal Global_Clk.

In some exemplary embodiments, the driver BUF may have a function of frequency divider, dividing (×1, ×0.5, . . . ) the frequency of the phase-interpolated clock signal 226 to provide more frequency options for the local clock signal Local_Clk.

Especially, an MDLL can be quickly switched to provide the different multiplication factors (e.g., ×1 or ×8) for frequency multiplying. Because the MDLL implementing the 8-phase generator 214 can quickly change its multiplication factor, there is no need to use several PLLs in the global clock generator 116 to generate several global clock candidates (e.g., one PLL generating 1G clock, and another PLL generating 500M clock) to be selected and transferred as the global clock signal Global_Clk. The global clock generator 106 can use just one PLL (202). Less power is required. Furthermore, the circuit area of a single PLL is smaller than two PLLs. The circuit cost is low.

In an exemplary embodiment, the PLL 202 generates the global clock signal Global_Clk oscillating at 1G Hz. The 8-phase generator 214 implemented by an MDLL provides two options for the multiplication factor: one is ×8, and the other is ×4. Thus, the local clock signal Local_Clk may oscillate at 8G Hz (or a frequency that the buffer BUF divides from 8 GHz) or be switched to oscillate at 4G Hz (or a frequency that the buffer BUF divides from 4 GHz). It is suitable to use such a clock scheme circuit in a high speed LPDDR.

Figure 3:
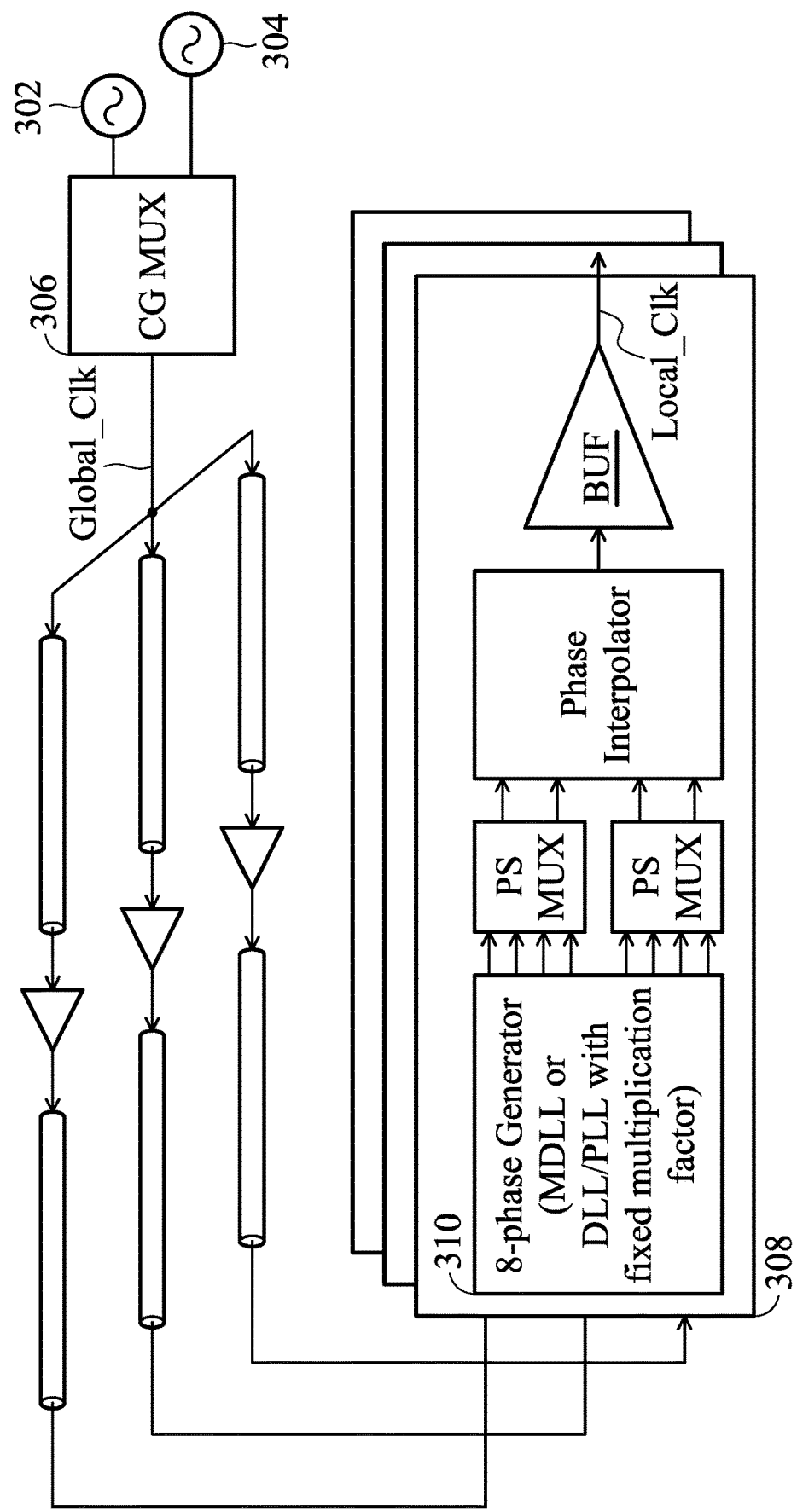
FIG. 3 illustrates a variant of the clock scheme circuit of FIG. 2 in accordance with an exemplary embodiment of the present invention.

If the 8-phase generator 214 implemented by an MDLL does not provide several options for the multiplication factor, the global clock generator 106 may use multiple PLLs. FIG. 3 illustrates a variant of the clock scheme circuit of FIG. 2 in accordance with an exemplary embodiment of the present invention. Two PLLs 302 and 304 are used to implement the global clock generator 106. The PLL 302 may generate a 1G clock, and the PLL 304 may generate a 500M clock. The 1G clock and the 500M clock are global clock candidates, and one of them is selected by the clock gating multiplexer 306 to be the global clock signal Global_Clk to be transferred to the local clock generator 308. The 8-phase generator 310 in the local clock generator 308 may be an MDLL that provides a fixed multiplication factor, such as ×8. In FIG. 3, although one more PLL (in compared with FIG. 2) is required to implement the global clock generator 106, the clock scheme circuit of FIG. 3 still has the capability to provide various local clock signals as the clock scheme circuit of FIG. 2.

Figure 4:
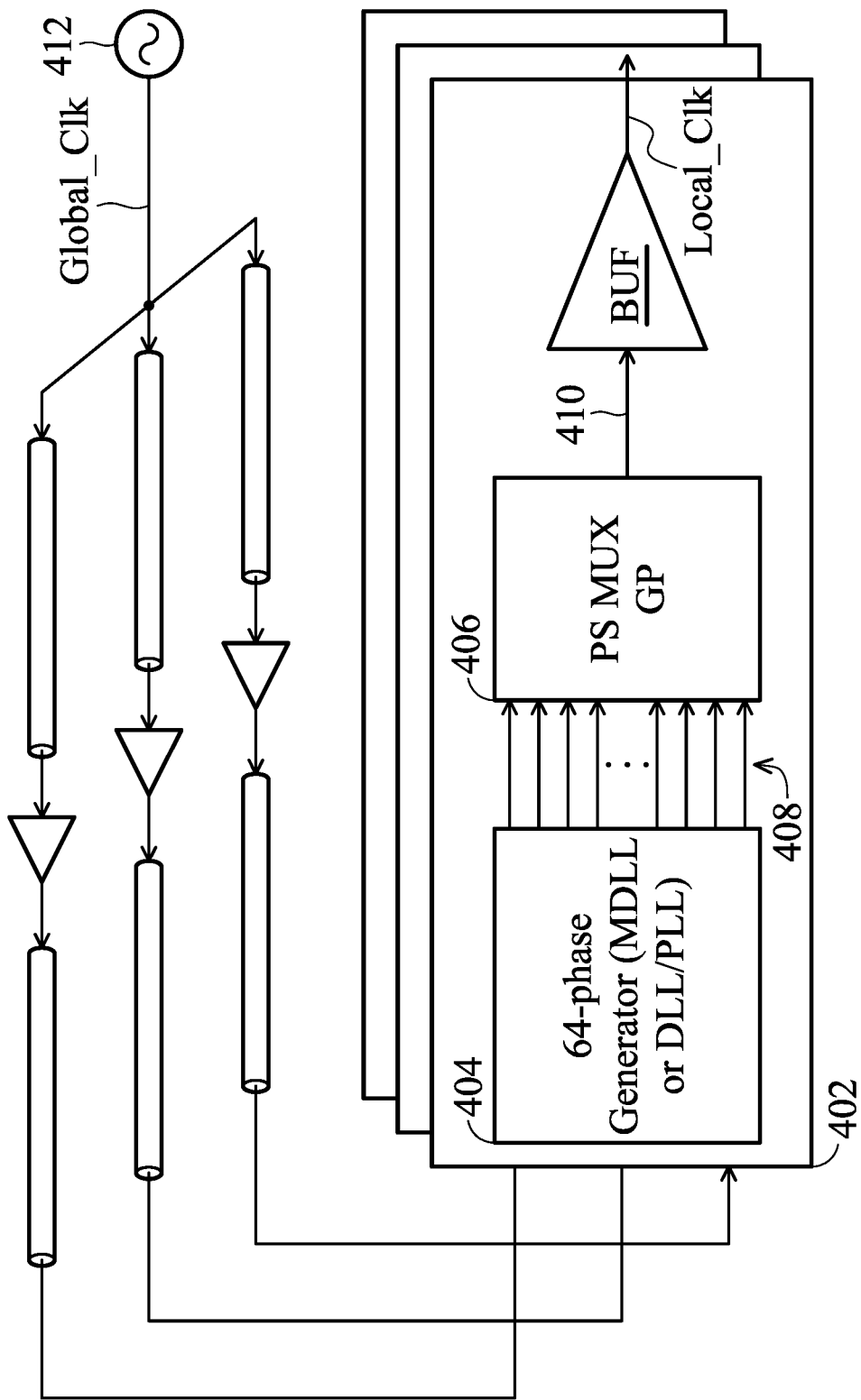
FIG. 4 illustrates a clock scheme circuit in accordance with another exemplary embodiment of the present invention.

FIG. 4 illustrates a clock scheme circuit in accordance with another exemplary embodiment of the present invention. In comparison with the local clock generator 212 of FIG. 2, a more power-saving local clock generator 402 is shown. The local clock generator 402 has a 64-phase generator 404, a phase selection multiplexer 406, and a driver BUF. The 64-phase generator 404 may be implemented by an MDLL or a DLL/PLL, which provides the function of frequency multiplier and generates 64 split-phase clock signals 408. The phase selection multiplexer 406 receives all of the 64 split-phase clock signals 408, and outputs one selected split-phase clock signal 410 to the driver BUF. The driver BUF may have the function of frequency divider, dividing (×1, ×0.5, . . . ) the frequency of the selected split-phase clock signal 410 to provide more frequency options for the local clock signal Local_Clk.

In comparison with the local clock generator 212 of FIG. 2, the local clock generator 402 of FIG. 4 does not use the phase interpolator 220 that consumes considerable power. The phase selection multiplexer 406 may be implemented by a group of multiplexer switches (abbreviated as PS MUX GP). The glitch and PVT sensitive problems due to the phase interpolator 220, therefore, are solved.

In an exemplary embodiment, the 64-phase generator 404 implemented by an MDLL can be switched between different multiplication factors for frequency multiplying, and only one PLL 412 is required to implement the global clock generator 106.

In an exemplary embodiment, the PLL 412 generates the global clock signal Global_Clk oscillating at 1G Hz. The 64-phase generator 404 implemented by an MDLL provides two options for the multiplication factor: one is ×8, and the other is ×4. Thus, the local clock signal Local_Clk may oscillate at 8G Hz (or a frequency that the buffer BUF divides from 8 GHz) or be switched to oscillate at 4 G Hz (or a frequency that the buffer BUF divides from 4 GHz). It is suitable to use such a clock scheme circuit in a high speed LPDDR.

Figure 5:
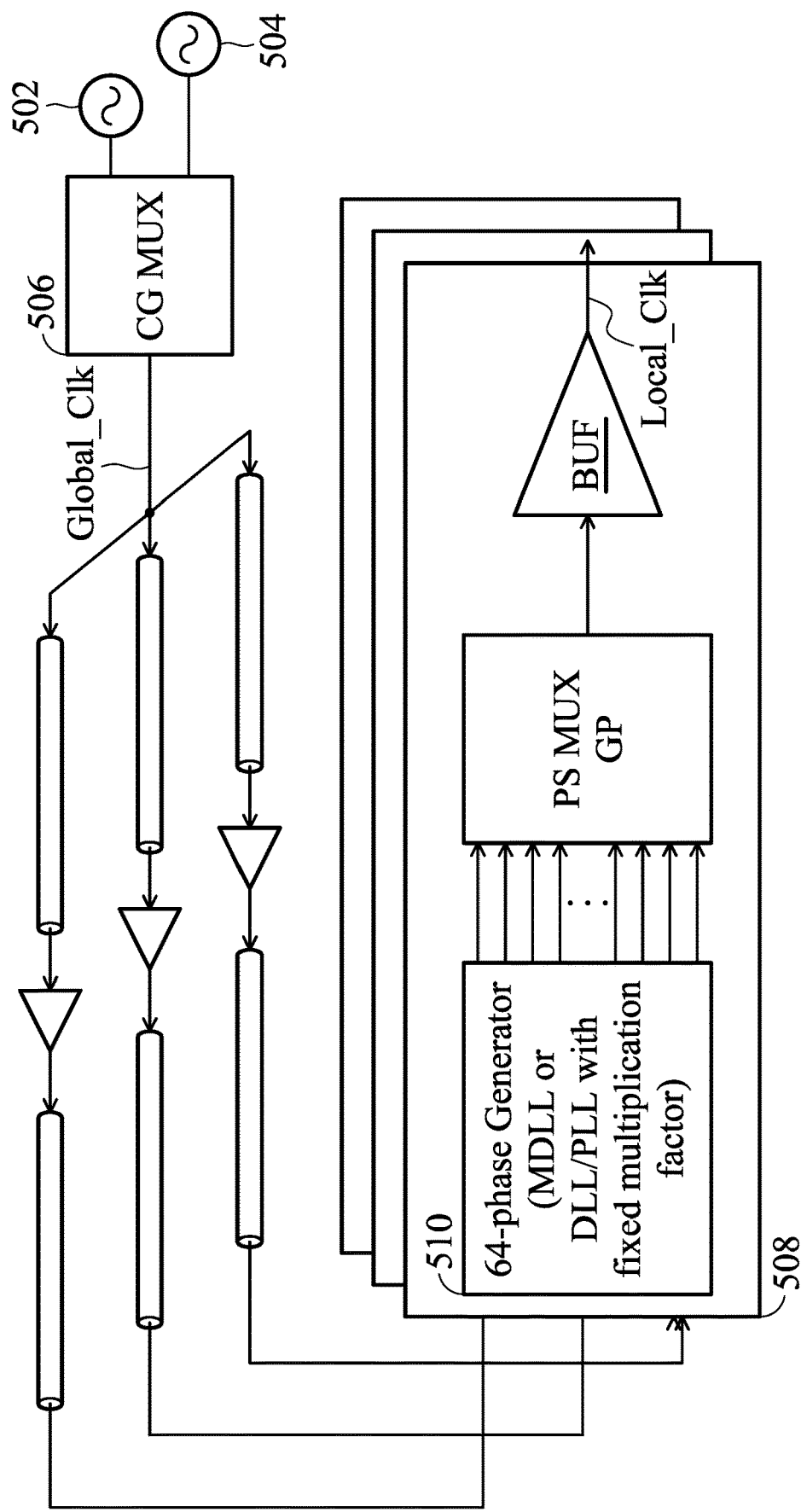
FIG. 5 illustrates a variant of the clock scheme circuit of FIG. 4 in accordance with an exemplary embodiment of the present invention.

If the 64-phase generator 404 implemented by an MDLL does not provide several options for the multiplication factor, the global clock generator 106 may use multiple PLLs. FIG. 5 illustrates a variant of the clock scheme circuit of FIG. 4 in accordance with an exemplary embodiment of the present invention. Two PLLs 502 and 504 are used to implement the global clock generator 106. The PLL 502 may generate a 1G clock, and the PLL 504 may generate a 500M clock. The 1G clock and the 500M clock are global clock candidates, and one of them is selected by the clock gating multiplexer 506 to be the global clock signal Global_Clk to be transferred to the local clock generator 508. The 64-phase generator 510 in the local clock generator 508 may be an MDLL that provides a fixed multiplication factor, such as ×8. Although one more PLL is required in the global clock generator 106, the clock scheme circuit of FIG. 5 still provides various local clock signals as the clock scheme circuit of FIG. 4.

Figure 6:
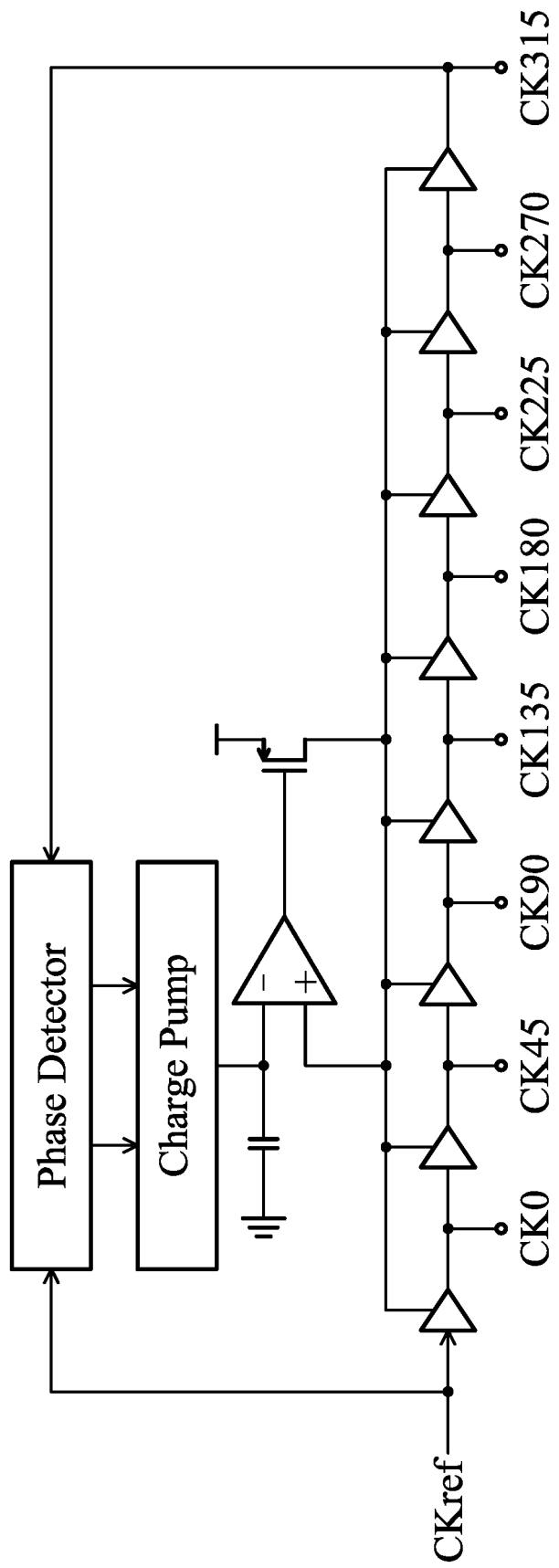
FIG. 6 illustrates how to use a DLL to implement the 8-phase generator 214 in accordance with an exemplary embodiment of the present invention.

FIG. 6 illustrates how to use a DLL to implement the 8-phase generator 214 (or 310) in accordance with an exemplary embodiment of the present invention. There are 8 delay cells, each outputs a split-phase clock signal. As shown, the global clock signal Global_Clk transferred from the global clock generator 106 to the local clock generator 110 through the global clock trace 108 is CKref, and after being delayed by the delay cells, 8 split-phase clock signals CK0, CK45, CK90, CK135, CK180, CK225, CK270, and CK315 are generated to be sent to the phase selection multiplexers 216 and 218. In the DLL design, the 8 split-phase clock signals CK0, CK45, CK90, CK135, CK180, CK225, CK270, and CK315 oscillate at the same frequency as the global clock signal CKref.

In another exemplary embodiment, more delay cells are added to the 8-phase generator of FIG. 6 to form the 64-phase generator 404 of FIG. 4 (or 510 of FIG. 5). To implement the 64-phase generator 404 of FIG. 4, 64 delay cells are required, and 64 split-phase clock signals are generated to be sent to the phase selection multiplexer 406.

Figure 7:
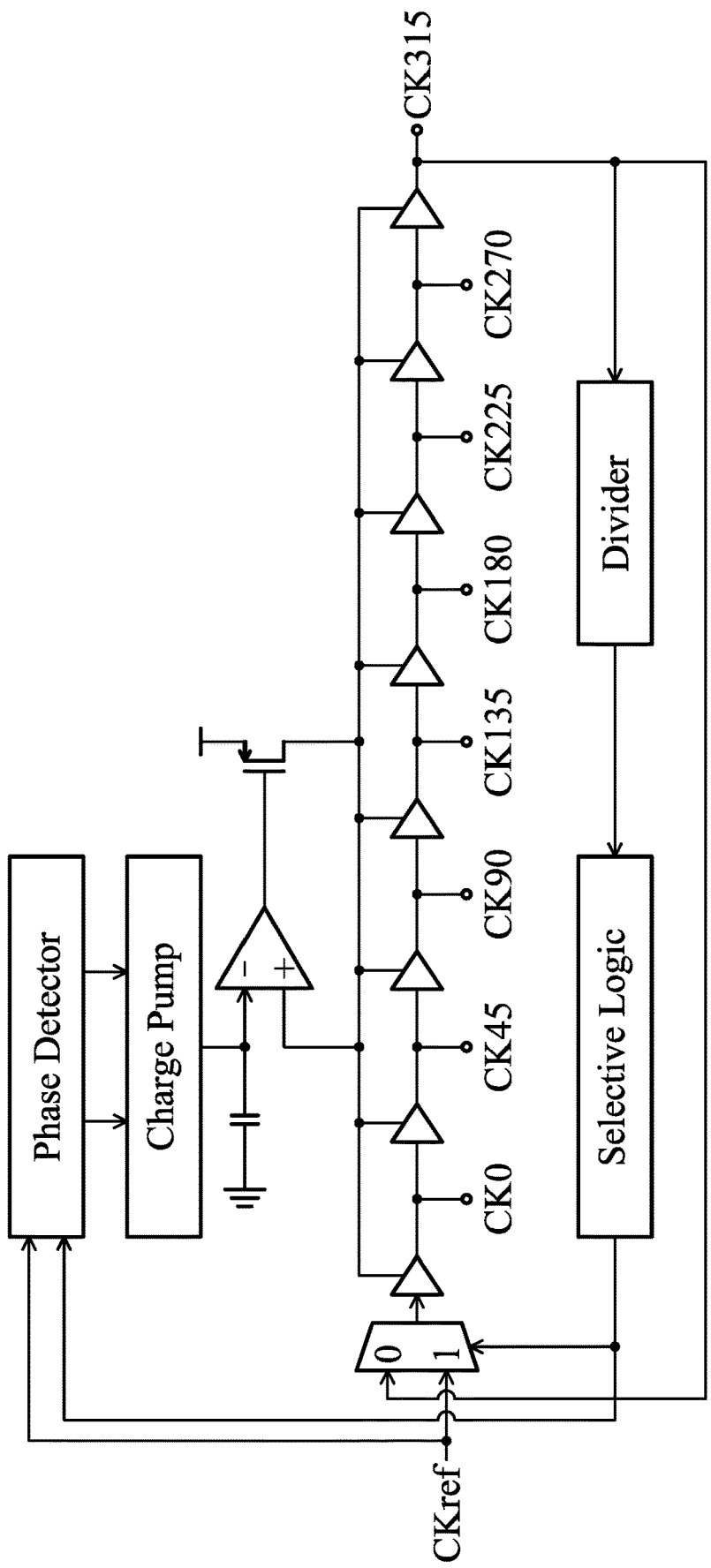
FIG. 7 illustrates how to use an MDLL to implement the 8-phase generator 214 in accordance with an exemplary embodiment of the present invention.

FIG. 7 illustrates how to use an MDLL to implement the 8-phase generator 214 (or 310) in accordance with an exemplary embodiment of the present invention. There are 8 delay cells, each outputs a split-phase clock signal (CK0, CK45, CK90, CK135, CK180, CK225, CK270, or CK315). As shown, the global clock signal Global_Clk transferred from the global clock generator 106 to the local clock generator 110 through the global clock trace 108 is CKref. The global clock signal CKref and the clock signal CK315 are selectively sent to the delay cells, and after being delayed by the delay cells, 8 split-phase clock signals CK0, CK45, CK90, CK135, CK180, CK225, CK270, and CK315 are generated. According to such an MDLL design, the 8 split-phase clock signals CK0, CK45, CK90, CK135, CK180, CK225, CK270, and CK315 oscillate at the multiple times of frequency of the global clock signal CKref.

In another exemplary embodiment, more delay cells are added to the 8-phase generator of FIG. 7 to form the 64-phase generator 404 of FIG. 4 (or 510 of FIG. 5). To implement the 64-phase generator 404 of FIG. 4, 64 delay cells are required.

Any clock scheme circuit having the frequency multiplier 112 in the local clock generator 110 should be considered within the scope of the invention. The frequency multiplier 112 may be implemented by a multi-phase generator (e.g., the 8-phase generator 214 and the 64-phase generator 510).

The multi-phase generator may be an MDLL, DLL, or PLL to benefit from their background calibration capability.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clock scheme circuit, comprising:
    a global clock generator and a global clock trace; and
    a local clock generator, coupled to the global clock generator through the global clock trace to receive a global clock signal, and generate a local clock signal based on the global clock signal,
    wherein:
    the local clock generator comprises a frequency multiplier;
    the local clock generator generating the local clock signal uses the frequency multiplier to multiply a frequency of the global clock signal by a multiplication factor of not less than 1;
    the global clock generator uses multiple phase-locked loops to generate multiple global clock candidates; and
    a clock gating multiplexer is provided on the global clock trace to select one of the global clock candidates as the global clock signal to be transferred to the local clock generator.

2. The clock scheme circuit as claimed in claim 1, wherein:
    the frequency multiplier is provided by a multiplying delay-locked loop.

3. The clock scheme circuit as claimed in claim 1, wherein:
    the frequency multiplier is provided by a delay-locked loop or a phase-locked loop.

4. The clock scheme circuit as claimed in claim 1, wherein the local clock generator further comprises:
    a multi-phase generator, providing the frequency multiplier, and generating split-phase clock signals to be processed to generate the local clock signal.

5. The clock scheme circuit as claimed in claim 4, wherein the local clock generator further comprises:
    a plurality of phase selection multiplexers; and
    a phase interpolator;
    wherein:
    each phase selection multiplexer receives several of the split-phase clock signals to output selected two split-phase clock signals; and
    the phase interpolator is coupled to output terminals of the phase selection multiplexers to perform phase interpolation on split-phase clock signals selected by the phase selection multiplexers, for generation of the local clock signal.

6. The clock scheme circuit as claimed in claim 5, wherein the local clock generator further comprises:
    a driver, receiving a phase-interpolated clock signal from the phase interpolator to generate and output the local clock signal.

7. The clock scheme circuit as claimed in claim 6, wherein the driver comprises:
    a frequency divider, dividing a frequency of the phase-interpolated clock signal to generate the local clock signal.

8. The clock scheme circuit as claimed in claim 6, wherein:
    the multi-phase generator generates 8 split-phase clock signals; and
    two phase selection multiplexers are provided, and each phase selection multiplexer receives 4 split-phase clock signals.

9. The clock scheme circuit as claimed in claim 4, wherein the local clock generator further comprises:
    a phase selection multiplexer, receiving all of the split-phase clock signals to output one selected split-phase clock signal for generation of the local clock signal.

10. The clock scheme circuit as claimed in claim 9, wherein the local clock generator further comprises:
    a driver, receiving the selected split-phase clock signal from the phase selection multiplexer to generate and output the local clock signal.

11. The clock scheme circuit as claimed in claim 10, wherein the driver comprises:
    a frequency divider, dividing a frequency of the selected split-phase clock signal to generate the local clock signal.

12. The clock scheme circuit as claimed in claim 10, wherein:
    the multi-phase generator generates 64 split-phase clock signals.

13. The clock scheme circuit as claimed in claim 1, wherein the local clock generator is coupled to a functional unit with a local clock trace, and the global trace is longer than the local clock trace.

14. The clock scheme circuit as claimed in claim 13, the global trace is more than 10 times longer than the local clock trace.

15. A mobile double data rate memory, comprising:
    a DQ unit, having a transmitter and a receiver; and
    the clock scheme circuit as claimed in claim 1, providing the local clock signal to at least one of the transmitter and receiver through a local clock trace.

* * * * *